United States Patent [19]

Martin

[11] 4,041,311
[45] Aug. 9, 1977

[54] SCANNING ELECTRON MICROSCOPE WITH COLOR IMAGE DISPLAY

[75] Inventor: David Michael Martin, Ames, Iowa

[73] Assignee: Iowa State University Research Foundation, Inc., Ames, Iowa

[21] Appl. No.: 704,181

[22] Filed: July 12, 1976

[51] Int. Cl.² .............................................. H01J 37/00
[52] U.S. Cl. ........................................ 250/311; 250/310
[58] Field of Search ........... 250/310, 311, 313, 416 TV

[56] References Cited

U.S. PATENT DOCUMENTS 3,628,014  12/1971  Grubic ............................. 250/310
3,812,288  5/1974  Walsh et al. ..................... 250/310

OTHER PUBLICATIONS

"Color Display in Electron Probe Microanalysis," Ordonez, *Metallography*, vol. 4, No. 6, pp. 575-579, (1971).
"Electron Microprobe Analysis Through Colorimetry," DiGiacomo et al., *IBM Tech. Disclosure Bulletin*, vol. 14, No. 1, pp. 165-166, (June 1961).

*Primary Examiner*—Alfred E. Smith
*Assistant Examiner*—B. C. Anderson
*Attorney, Agent, or Firm*—Tilton, Fallon, Lungmus, Chestnut & Hill

[57] ABSTRACT

The system includes a scanning electron microscope (SEM) and a color kinescope (CRT). The electron beams of the SEM and the CRT are driven in a synchronized raster. A first signal representative of back-scattered electrons, for example, is fed to a color encoder section, the output of which drives each of the red, green and blue guns of the CRT to generate a uniquely encoded color representation of the information in the first signal. A second signal, which may be derived from the secondary electron image of the sample is used to modulate the brightness of the CRT in accordance with the scanning electron beam. There is thus presented on the CRT a color image of high resolution and information content, and one which is ideally suited to human perception.

7 Claims, 5 Drawing Figures

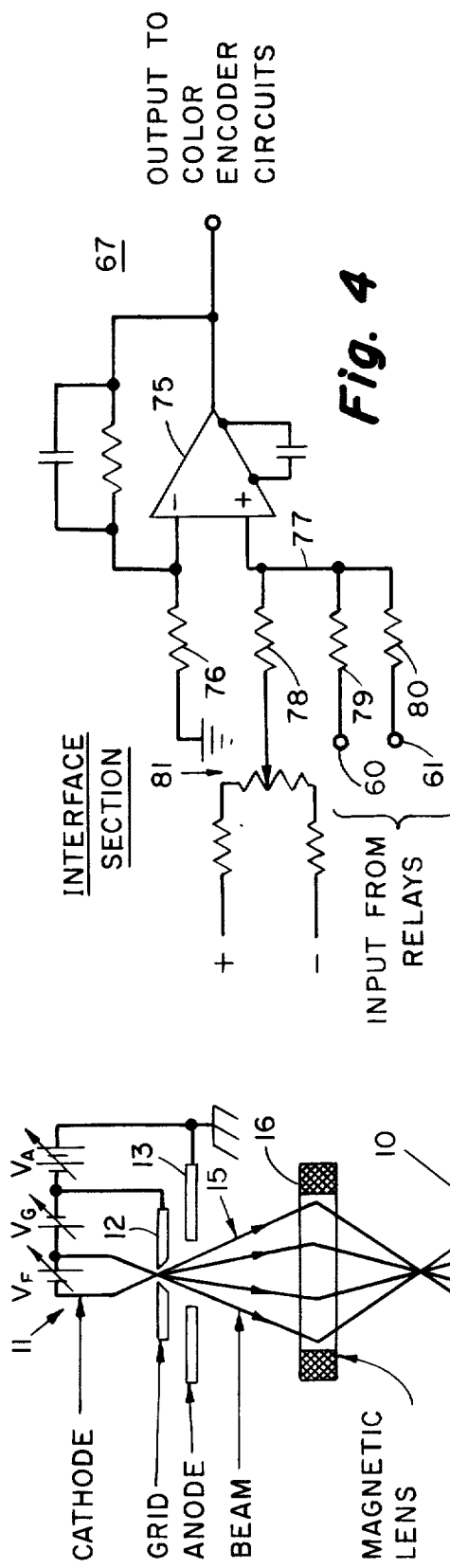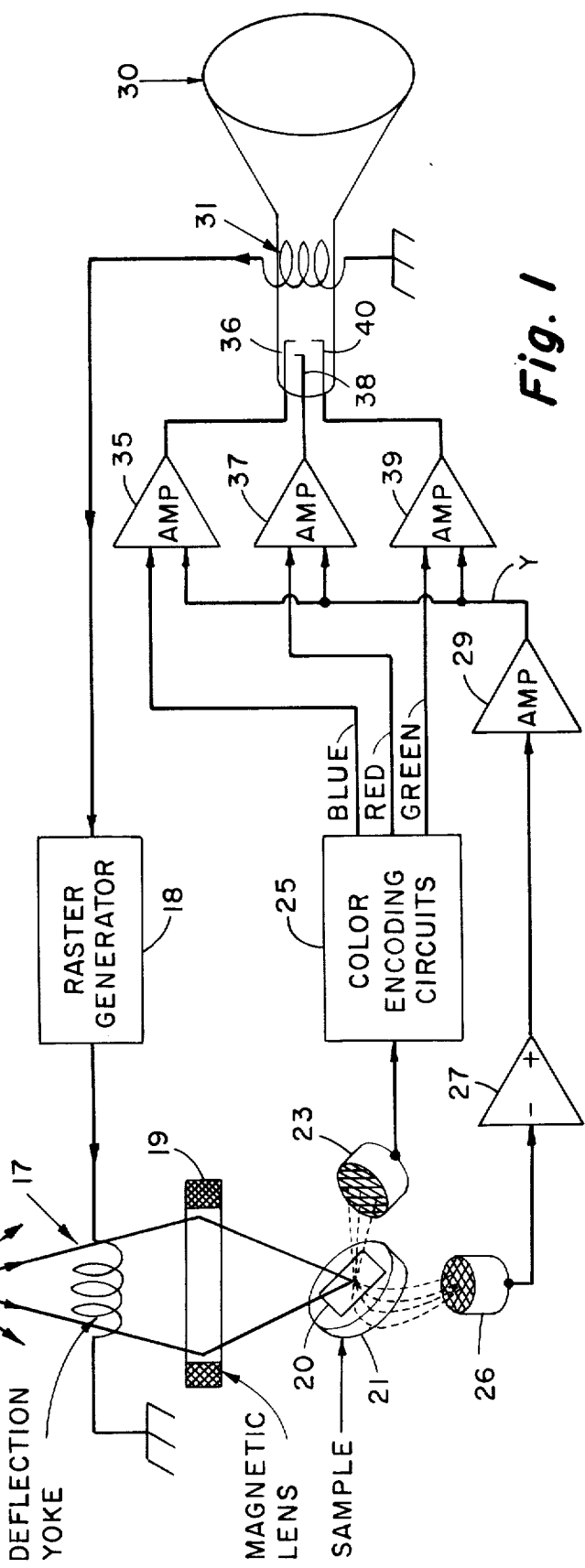

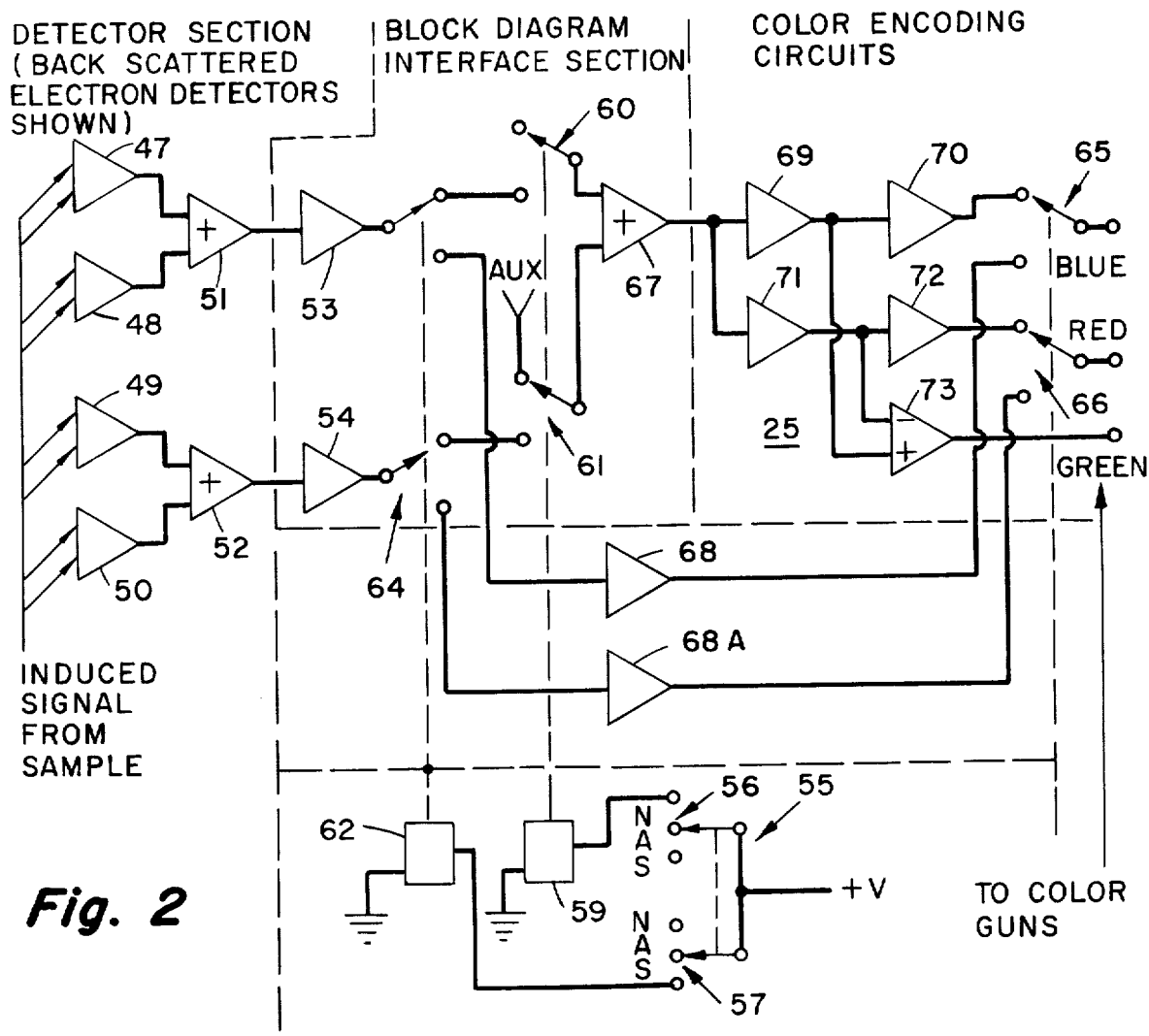
*Fig. 2*
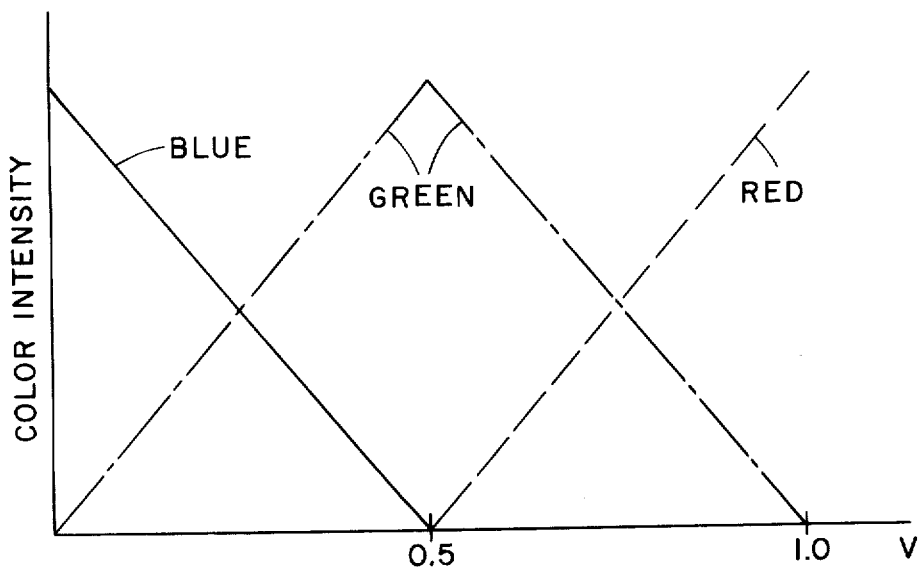
*Fig. 5* INTENSITY OF BACKSCATTERED ELECTRON SIGNAL

SCANNING ELECTRON MICROSCOPE WITH COLOR IMAGE DISPLAY

BACKGROUND AND SUMMARY

The present invention relates to scanning electron microscopes (SEM); and more particularly to a scanning electron microscope which is provided with a color image display.

Scanning electron microscopes are known to be useful instruments in the observation and analysis of matter. The use of the SEM encompasses both scientific analysis and routine, industrialized quality monitoring of samples.

Generally, an SEM includes a vacuum chamber, an electron optical system for generating and focusing an electron beam (sometimes referred to as the "primary electron beam"), a deflection system for moving the beam across a sample in a predetermined pattern, a detector system for detecting phenomena from the sample caused by the impinging electron beam, and a display system. When the electron beam strikes the sample, a complex response is generated, including both short-lived and long-lived phenomena. The short-lived phenomena include, but are not limited to:

1. Secondary electrons (low energy);
2. Backscattered electrons (high energy);
3. X-rays characteristic of the sample;
4. "White" X-rays;
5. Light (cathodoluminescence);
6. Adsorbed electrons;
7. Transmitted electrons;
8. Auger process electrons (low energy).

Detectors are known for detecting each of the above phenomena, and there are also available mass detectors and surface potential detectors for use in an SEM.

In a conventional SEM, one of the signals identified above is detected, amplified, and displayed on a cathode ray tube (CRT) with the amplitude of the signal used to modulate the intensity of the beam of the CRT. The beam of the CRT is deflected in a raster pattern which corresponds to and is synchronized with the scanning beam of the SEM. Thus, a black and white image of the sample is presented to the operator of the microscope. The image thus created may be said to contain three bits of information at each point on the CRT—two position vectors which identify the location of the primary beam on the sample, and one brightness or intensity level which contains information about the sample. The intensity level is usually derived from the secondary electron emission, which contains topographical (slope) information. The information thus presented is in a form which is readily accepted by the human operator who, by means of his physiological and psychological systems, can rapidly assimilate the information. Only one of the many signals which are induced by the primary beam can be displayed in a conventional SEM system at any one time.

Each of the various responses of the sample to the primary beam includes unique information about the sample. For example, the secondary electron intensity contains information about the slope of the sample surface with respect to the primary beam, and this information can be used to generate an image of the sample surface. As another example, the back-scattered electron signal contains information of the atomic number of the sample, and thus can be used to provide a profile having an intensity which is representative of the chemical makeup rather than the shape of the sample being studied. In a conventional SEM system, with display, the operator can observe one of these images at a time.

Color synthesizers have been utilized by others to enhance the display image of SEM's in the past. For the most part these color imaging schemes have not increased the information content of the image but have been utilized merely to make a more esthetically pleasing picture. Color pictures have been produced photographically by means of multiple exposures of film through appropriately colored filters. Further, a system has been suggested in which three separate X-rays, each representative of a different element, are used to modulate respectively the three electron guns of a color kinescope. That is, each X-ray detector is associated with a different color, and these elements are then displayed concurrently and in color. The resultant image defines the distribution of the elements in the sample since each one is represented by a different color.

The present invention generates color images from the information available in an SEM and displays the images on a color CRT. The images are continuous in hue and cover the entire color range; and they are, of course, generated in real time, as distinguished from photographic images. According to the present invention, a first type of detector generates a signal or signals which are color encoded and fed to the tri-color guns of a CRT. The CRT may be either of the tri-dot (shadow mask) type or it may be of the tri-striped type, such as the Sony Trinitron system. In either case, the color video information is reinforced with a second video signal which provides additional information about the sample, and is coordinated with the scanning of the samples by the primary electon beam.

As a specific example, in the application of the present invention to imaging backscattered electrons in a Scanning Electron Microscope, the backscattered electrons are detected and a signal represented thereof is fed to color encoding circuits. The color encoding circuits generate three distinct signals which are coupled respectively to the blue, red and green guns of a tri-color kinescope. The encoding of the information in the signal representative of backscattered electrons may be arbitrary, but the intensity of each individual color signal should be a variable function of the input signal amplitude for at least a portion of the signal range so as to obtain a continuous variation in hue of the image thus generated.

As an example, the blue video signal of the disclosed embodiment is set at a maximum when the input backscattered signal is at a zero level, and the blue video signal decreases linearly until the mid-range of the input signal is reached, after which time the blue video signal is at shut-off. The green signal increases continuously until the mid-range point of the input signal, and thereafter decreases so as to return to a zero level green signal at the maximum input signal. The red video signal is zero until the input signal reaches its midpoint, and thereafter it increases continuously until the input signal reaches a maximum. Although this type of color encoding system may be modified, the particular one described has been shown to be useful because it presents a continuous range of hues throughout the entire range of input signal level and emphasizes the red signal (usually perceived to be associated with intensity) at the higher input levels. This type of signal has been found to be readily suited for immediate perception by a human.

The second signal may be derived from secondary electron emission from the sample, and this signal is used to vary the brightness of the color signals. The color signals modulate respectively the three beams which are deflected in a raster or pattern which corresponds to the scanning pattern of the primary electron beam in the SEM, so that the secondary electron signal (which inherently bears topographical information concerning the sample) is synchronized with the scanning primary beam. There thus appears a clear image which bears topographical information concerning the sample and superimposed therewith, a color encoded representation of other information. In the case of backscattered electron emission, such other information is representative of the average atomic number of the material or sample.

The present invention thus correlates one type of information (namely, average atomic number of a sample) with a second type of information such as topographical or spatial information in such a manner that the resultant image is ideally suited to human perception. In the example given, a continuous color hue representative of atomic number when combined with the topographical information generates an image which has the spatial or geometrical aspects of the sample correlated with a color profile representative of the average atomic number.

In other words, the present invention uses hue (i.e., a fine discrimination between the primary colors) rather than color intensity to generate the characteristic profile of the information sought. Psychologically, the ability of a person to distinguish color intensity is relatively poor, but one's ability to distinguish color variations is quite good. By varying the intensity of at least one of the primary color signals over a continuous range of input signal while using at least two primary colors at all times, the amplitude of the input signal is changed to hue variation.

Other features and advantages, as well as other uses of the present invention, will be apparent to persons skilled in the art from the following detailed description of one embodiment accompanied by the attached drawing, wherein identical reference numerals refer to like parts in the various views.

THE DRAWING

FIG. 1 is a schematic diagram of a system incorporating the present invention;

FIG. 2 is a more detailed block diagram of the detection and color encoding circuitry of FIG. 1;

FIG. 4 is a circuit schematic diagram of the adder circuit which interfaces the detection section with the color encoding circuitry of FIG. 2; and FIG. 5 is a graph illustrating the intensity respectively of the blue, red and green color signals as a function of the intensity of the backscattered electron signal.

DETAILED DESCRIPTION

Figure 3:
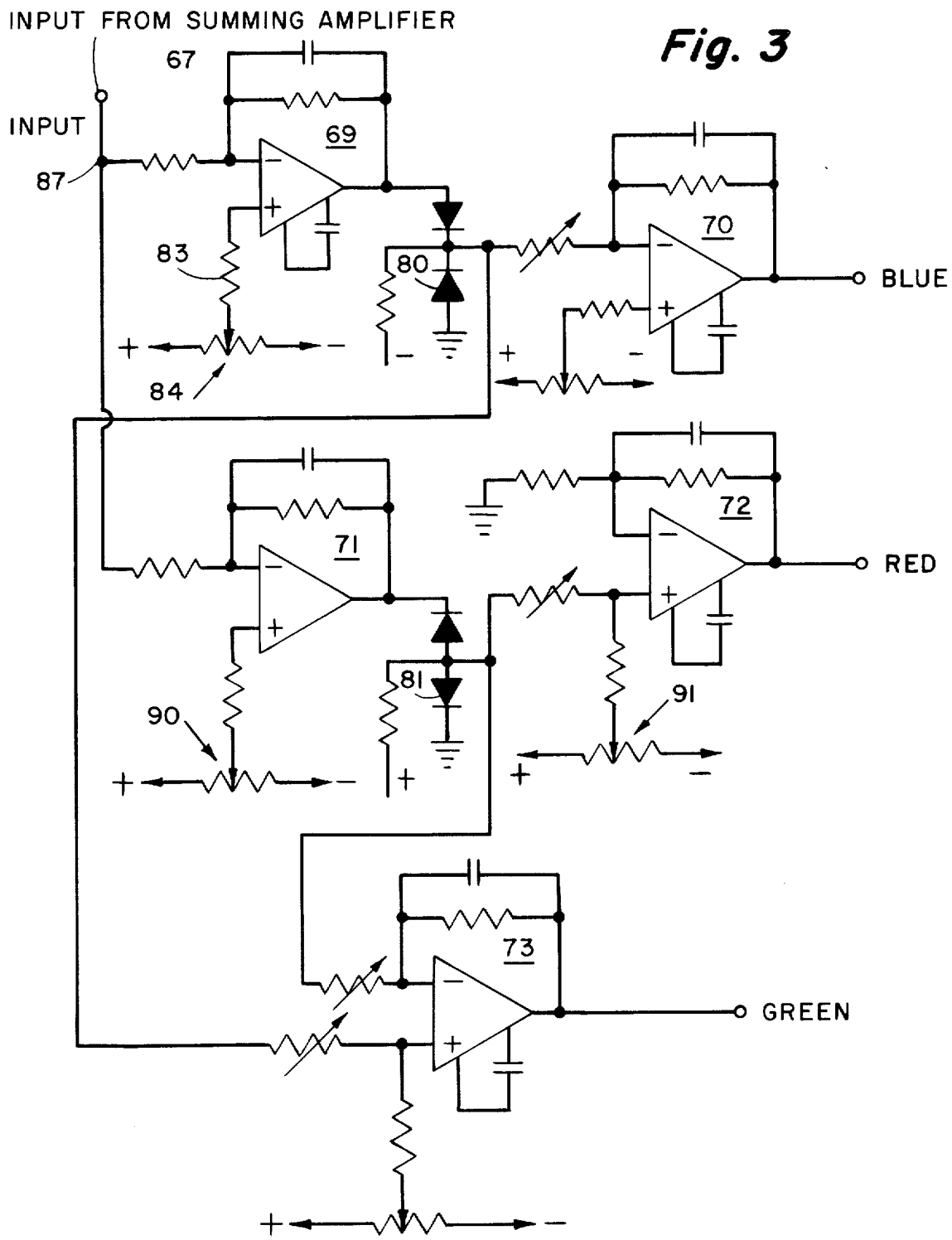
FIG. 3 is a circuit schematic diagram of the color encoding circuits.

Referring first to FIG. 1, reference numeral 10 generally designates a scanning electron microscope (SEM). The SEM 10 includes a cathode 11 for generating electrons which are controlled by a grid 12 and accelerated by an anode 13. The beam referred to as the "primary beam" is generally designated by reference numeral 15. It has a tendency to diverge after acceleration, and a magnetic coil 16 is used to focus the beam. The beam passes through a deflection yoke which is energized by the raster generator or scan generator 18. Thereafter, the beam is focused a second time by means of a magnetic lens 19 onto a specimen 20 which rests on a support 21. The raster generator 18 causes the beam to scan the specimen 20 in a predetermined pattern which may be similar to the scan raster of a color television kinescope, as will be appreciated.

A first detector, designated 23 in the drawing is used to detect backscattered electrons. In a preferred form, the detector 23 comprises four individual diode detectors (further shown in FIG. 2), the output signals of which are accumulated to generate a single output signal representative of the intensity of backscattered electrons. This signal (representative of atomic number) is fed to Color Encoding Circuits 25. The four detectors are placed symmetrically about the sample and at an angle of 75° relative to the axis of the primary beam. The use of a plurality of backscattered electron sensors reduces the effect of secondary electrons on these sensors which would otherwise impose topographical information on the atomic number signal.

A second type of detector 26, such as a scintillation photomultiplier tube is used to detect secondary electrons. The secondary electron signal is fed to an inverting amplifier 27, the output of which is coupled to the input of an amplifier 29 in a conventional color television receiver known as the "Y" or video stage amplifier. The output of the amplifier Y is a signal representative of the light intensity of the image to be displayed on the color kinescope, generally designated by reference numeral 30.

In the illustrated embodiment, the color television tube employed is not of the tri-dot/shadow mask type, but rather it has vertically oriented continuous lines of the color-emitting phosphor. This type of tube is manufactured by Sony Corporation and marketed under the trademark Trinitron.

The tube 30 also includes a deflection yoke 31 which is synchronized with raster generator 18 and causes the electron beam 15 to scan the sample 20.

In the type of color television receiver illustrated, the video signals are fed to separate grids. Hence, the blue video signal (B) is fed to an input of a first video amplifier 35, the output of which is connected to a grid 36 for modulating the intensity of the blue beam; the red video signal (R) is fed to an input of an amplifier 37, the output of which is connected to a grid 38 for modulating the intensity of the red beam; and the green video signal (G) is coupled to an input of an amplifier 39, the output of which is fed to a grid 40 for modulating the intensity of the green beam in the tube 30. Each of the amplifiers 35, 37 and 39 also receives the Y signal, and these amplifiers add the Y or brightness signal respectively to the three color signals. Hence, each of the color signals is also modulated in accordance with the brightness signal.

In the tri-dot/shadow mask type of tube, the blue, red and green signals may be fed directly to the three cathodes of the color guns, and the brightness signal may be coupled in to the G1 grids, all tied together so as to modulate the three color signals with the same brightness signal.

Turning now to FIG. 2, for the illustrated application, four backscattered electron detectors designated respectively 47, 48, 49 and 50 are arranged symmetrically around the sample to minimize topographic modulation. The detectors 47–50 may be barrier-layer diodes. The output signals from detectors 47, 48 are added in a summing amplifier 51, and the output signals of detectors 49, 50 are added in a summing amplifier 52. The outputs of amplifiers 51, 52 are fed respectively to the input of amplifiers 53, 54 which serve as power amplifiers.

The system has a number of different modes of operation which are controlled by a three-position switch generally designated 55. The switch 55 has a first section 56 and a second section 57, the wipers of which are coupled together electrically and connected mechanically. The switch 55 has three positions—N (normal), A (auxiliary), and S (three-dimensional display). A first relay 59 has its coil connected to the N contact of the switch section 56. The relay 59 has first and second sets of two-position contacts designated respectively 60 and 61. A second relay 62 has its coil connected to the S position of the switch section 57. The relay 62 is provided with four sets of two-position contacts designated respectively 63, 64, 65 and 66.

The output of amplifier 53 is connected to the movable contact of relay contacts 63; and the output of amplifier 54 is connected to the movable contact of relay contacts 64. The normally open terminals of the contacts 63, 64 are connected respectively through amplifiers 68, 68A to the normally open terminals of contacts 65, 66. The movable arm of contacts 60, 61 are connected respectively to the inputs of a summing amplifier 67, the output of which is fed to the color encoding circuits 25. The color encoding circuits are shown in circuit schematic in FIG. 3, and in more functional form in FIG. 2, as including five amplifiers designated respectively by reference numerals 69-73. Amplifiers 69, 70 are cascaded, and the output signal of amplifier 70 is fed to the normally closed terminal of contacts 65 which provides the blue video signal. Amplifiers 71 and 72 are similarly cascaded; and the output of amplifier 72 is fed to the normally closed terminal of relay contact 66 to provide the red video signal. Amplifier 73 receives its input signals from amplifiers 69 and 71 respectively, and its output signal provides the green video signal.

For operation in the normal mode, the switch 55 is turned to the N position, and relay 59 is energized. In this position, the output signals of amplifiers 53 and 54 are connected directly to the inputs of summing amplifier 67; and the output signals of amplifiers 70, 72 and 73 provide respectively the blue, red and green video signals. In order to understand the functional operation of the color encoding circuits 25, reference is made to FIGS. 2 and 5. It will be understood that a negative output signal is used to provide the video signals so that a more negative signal will provide a greater color intensity. However, in FIG. 5, increasing color intensity is shown along an increasing ordinate. The input signal to the color encoding circuits is seen to have a range of 0 – 1.0 volts. The color combination at any given input voltage is determined by proceeding vertically along the graph of FIG. 5 at the input voltage level to determine the intensity of the three color signals respectively. Briefly, the blue signal is at maximum intensity when the input signal is at zero volts, and it decreases continuously until mid-range of the input signal, after which the blue signal is shut off. The red signal, on the other hand, is shut off from zero input volts through mid-range, after which it increases continuously and becomes a maximum at the highest input voltage. The green signal is shut off at zero input volts, increases continuously until mid-range, and thereafter decreases continuously until the input voltage is at its maximum level. This color encoding scheme is designed so as to maximize a blue or dark hue for lower intensity signal and to enhance the red color for signals of greater intensity. Other color schemes may be used, but it is advantageous to have a color encoding scheme such that a unique color combination appears for each input signal level, and to have each of the color signals a variable function of the input signal amplitude over at least a portion of the input signal range.

Turning now to the amplifiers of the color encoding circuits in FIG. 2, amplifier 69 has its output clamped after the input signal reaches mid-range; and amplifier 71 has its output clamped until the input signal reaches mid-range. Amplifiers 69, 70 and 71 are connected in the inverting mode, amplifier 72 is connected in the non-inverting mode, and amplifier 73 is connected in the differential mode. When the input signal is at zero volts, the output of amplifier 69 is high, and the output of amplifier 70 is therefore at a maximum negative level. The output of amplifier 71 is clamped, but because amplifier 72 is connected in a non-inverting mode, its output is at a relatively high level (ground), and the red video signal is shut off. At this time, the output of amplifier 73 is also zero volts, so there is no green signal. As the input signal increases, the output of amplifier 69 proceeds negatively, whereupon the output of amplifier 70 goes positive to reduce the blue signal. As the positive input of amplifier 73 goes negative, the output signal also goes negative, thereby increasing the intensity of the green signal until mid-range of the input voltage is reached. At mid-range, the output of amplifier 69 is clamped, and the output of amplifier 71 recovers from its clamp voltage and begins to decrease. As the output of amplifier 71 decreases with further increase of the input signal, the output of amplifier 72 goes negative to increase the intensity of the red signal, and the output of amplifier 73 goes positive to decrease the intensity of the green signal.

Turning now to FIG. 4, there is shown a circuit schematic diagram of the summing amplifier 67. This summing amplifier includes an operational amplifier 75, the negative input of which is grounded by a resistor 76. The positive input is directly connected to a summing junction 77. Three equal resistors 78, 79 and 80 connect the summing junction respectively to a potentiometer 81, and the movable contacts of relays 60, 61. The potentiometer 81 is used to adjust the zero input level, and as signals are received from the amplifiers 53, 54, the signal at summing junction 77 increases, thereby increasing the output signal.

Turning now to FIG. 3, there is shown a detailed circuit schematic of the color encoding circuits 25. Each of the amplifiers 69-73 is an operational amplifier with feedback resistor and capacitor. Clamping of the output of amplifier 69 at a negative level is provided by diode 80 having its anode connected to ground. Clamping of the output of amplifier 71 is provided by a diode 81, having its cathode grounded. The positive input of amplifier 69 is connected by means of a resistor 83 to a potentiometer 84; and the positive input of amplifier 70 is similarly connected to a potentiometer 85. The potentiometer 84 is set such that when the input signal at terminal 87 is at zero level, the cathode of diode 80 is at a slightly negative voltage. With a slightly negative input voltage, the potentiometer 85 is set so that the output signal of the amplifier 70 is at a negative maximum. As the input signal at junction 87 increases, the cathode of diode 80 goes negative, and the output of amplifier 70 goes positive until the diode 80 saturates at 0.5 volts input, which is the mid-range of the input voltage.

The positive input terminals of amplifiers 71, 72 are connected respectively to potentiometers 90, 91. In operation of the red video channel, amplifier 71 inverts the incoming signal, but amplifier 72 is connected in a non-inverting mode. The diode 81 is conducting initially, and as the input voltage increases to its mid-range, the output of amplifier 71 decreases. At mid-range, the bias on diode 81 causes it to become non-conducting, and thereafter, as the input voltage increases, the voltage at the cathode of diode 81 decreases, and the output voltage of amplifier 72 decreases correspondingly until maximum negative output voltage is reached at maximum input voltage level. Thus, the red video signal remains at shut-off until the input voltage reaches mid-range, and it thereafter increases in intensity (that is, the voltage goes negative) as the input signal rises.

Amplifier 73 is connected to the voltage at the cathode of diode 80 in a non-inverting relationship, and to the voltage at the cathode of diode 81 in an inverting relationship. Hence, as the input signal increases from zero volts to mid-range, the output of amplifier 73 goes negative to increase the intensity of the green signal. At the voltage mid-point, the diode 80 becomes fully conducting so that the voltage across it does not change, but the voltage across diode 81 begins to decrease, thereby causing the output of amplifier 73 to go positive and decrease the intensity of the green signal.

If it is desired to use an input signal from another set of detectors, such as a mass detector, surface potential detector, etc., the switch 55 may be turned to the A position, in which case one of the inputs to summing amplifier 67 is grounded by means of contacts 60 of relay 59, and the other input is connected to an auxiliary input terminal which is the normally closed terminal of contact 61. The auxiliary signal is thus processed in the color encoding circuits 25 in a manner similar to that which has just been described—namely, it has a color profile as a function of intensity which is the same as is shown in FIG. 5.

A second color display mode is also possible which will provide stereographic information about the sample, and this is achieved by placing the switch 55 in the S position. In this position, the output signals of amplifiers 53, 54 are connected respectively to the inputs of amplifier 68, 68A which, in turn, drive the blue and red guns of the color kinescope respectively.

In this case, two suitable detectors (such as the ones designated 49, 50) are placed on one side of the sample, and the other two detectors 47, 48 are placed on the opposite side of the sample at suitable angles to the surface of the sample. The output signal of detectors 49, 50 drives the red color gun, and it is increased in proportion to the intensity of the detected signals, while the second set of detectors 47, 48, drives the blue color gun, also increasing in intensity in proportion to the intensity of the detected signal.

The colors thus generated are displayed on the color CRT which is again scanned in synchronization with the scanning of the primary electron beam in the SEM. The brightness of the display is again modulated in proportion to the secondary electron signal from amplifier 27 (FIG. 1). Thus, both the red and the blue signals are modulated by the brightness signal which latter signal conveys topographical information concerning the sample.

The resultant display, when viewed by a viewer wearing a suitable red filter over one eye and blue filter over the other eye shows a stereoscopic effect. In other words, the observer can psychologically interpret the red and blue images as areas which can be preferentially observed with one eye or the other and automatically relate this information to the three-dimensional shape of the sample. When a display is viewed without the aid of filters, the location of the red and blue colors on the sample can easily be interpreted by the viewer in terms of the shape of the object being viewed.

An important feature of the present invention is that the straight-line travel of the backscattered electrons from the sample to the detector provides a very accurate mapping of the surface shape of the sample onto these detectors. Because the geometry of the system is known, the observer can obtain quantitative information about the geometry of the sample by simple length measurements of the "shadows" cast by the object being displayed. In other words, the observer can make precise length measurements. Further, this permits a very accurate correlation of the information data thus gained with the image of the surface of the sample produced by the discharge of secondary electrons. Still further, this information is displayed in a manner which is inherently suited to perception by a human being, having greater resolution due to the variation in colors, and displaying intermediate or blending areas due to the variation in hue.

Having thus described in detail one embodiment of the invention, persons skilled in the art will be able to modify certain of the circuitry which has been illustrated and to substitute equivalent elements for those disclosed while continuing to practice the principle of the invention; and it is, therefore, intended that all such modifications and substitutions be covered as they are embraced within the spirit and scope of the appended claims.

I claim:

1. In combination with a scanning electron microscope having a primary electron beam impinging on a sample of material located in a target area and first deflection means including raster generator means for moving said primary beam in a predetermined pattern on said sample, an improved display system comprising: first detector means for detecting a first phenomenon induced from said sample in response to the impingement thereon of said primary electron beam and for generating a first signal representative thereof; color encoding circuit means receiving said first signal for generating first, second and third color signals therefrom, each color signal being a changing function of said first signal over at least a portion of the range of said first signal; color kinescope means having first, second and third electron beams, each generating a different color response in said kinescope means and responsive to said first, second and third color signals respectively, and said deflection means responsive to said raster generator means for deflecting said first, second and third electron beams in a pattern corresponding to said predetermined pattern, whereby said kinescope means generates a color image of said sample and the hue of said image at any point is representative of said first signal at the corresponding point on said sample; second detector means for detecting a second phenomenon induced from said sample in response to the impingement thereof of said primary electron beam and for generating a second signal representative thereof; and means responsive to said second signal for modulating the brightness of said color kinescope means in accordance with the detection of said second phenomenon.

2. The apparatus of claim 1 wherein said color encoding circuit means comprises first amplifier means for driving a first electron beam of said kinescope for decreasing the intensity of said first electron beam as said first signal increases over at least a portion of the range thereof.

3. The apparatus of claim 2 wherein said color encoding circuit means includes second amplifier means for driving said second electron beam of said color kinescope means for causing said second beam to increase in intensity over one portion of the range of said first signal as said first signal increases and to decrease intensity over a second range of said first signal as said first signal increases.

4. The apparatus of claim 3 wherein said color encoding circuit means comprises third amplifier means for driving said third electron beam of said color kinescope and for increasing the intensity of said beam over at least a portion of the range of said first signal as said first signal increases.

5. The apparatus of claim 1 wherein said first detector means comprises backscattered electron detector means for generating a signal representative of the intensity of backscattered electrons induced from said impinging primary electron beam on said sample.

6. The apparatus of claim 1 wherein said second detector means detects a sound phenomenon having information representative of the topography of said sample, whereby said topographical information is correlated with the position of said scanning primary beam on said sample.

7. In combination with a scanning electron microscope having a primary electron beam impinging on a sample material located in a target area and first deflection means including raster generator means for moving said primary beam in a predetermined pattern on said sample, an improved display system comprising: first and second detector means located respectively to either side of said sample for detecting a first phenomenon induced from said sample in response to the impingement of said primary electron beam and for generating first and second signals respectively representative thereof; color kinescope means having at least first and second electron beams, each generating a different color response in said kinescope means and responsive respectively to said first and second signals from said first and second detection means; second deflection means responsive to said raster generator means for deflecting said first and second electron beams in a pattern corresponding to said predetermined pattern; and third detector means for detecting a second phenomenon induced from said sample in response to the impingement thereon of said primary electron beam and for generating a third signal representative thereof; and means responsive to said third signal for modulating the brightness of said color kinescope means in accordance with the detection of said second phenomenon, whereby an observer may view a stereoscopic image of said sample by wearing first and second filters corresponding respectively to the first and second colors of said color kinescope.

* * * * *